(12) United States Patent
Kang et al.

(10) Patent No.: US 9,196,334 B2
(45) Date of Patent: Nov. 24, 2015

(54) HIERARCHICAL MEMORY MAGNETORESISTIVE RANDOM-ACCESS MEMORY (MRAM) ARCHITECTURE

(71) Applicant: QUALCOMM Incorporated, San Diego, CA (US)

(72) Inventors: Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 13/842,122

(22) Filed: Mar. 15, 2013

(65) Prior Publication Data

US 2013/0279244 A1 Oct. 24, 2013

Related U.S. Application Data

(60) Provisional application No. 61/635,346, filed on Apr. 19, 2012.

(51) Int. Cl.
| | | |
|---|---|---|
| G11C 11/16 | (2006.01) | |
| H01L 43/02 | (2006.01) | |
| G06F 12/08 | (2006.01) | |

(52) U.S. Cl.
CPC .......... *G11C 11/161* (2013.01); *G06F 12/0893* (2013.01); *G06F 12/0897* (2013.01); *G11C 11/1693* (2013.01); *H01L 43/02* (2013.01); *G06F 12/0811* (2013.01); *G06F 2212/2024* (2013.01); *G06F 2212/222* (2013.01); *Y02B 60/1225* (2013.01)

(58) Field of Classification Search
USPC ................................................... 365/230.05
See application file for complete search history.

(56) References Cited

U.S. PATENT DOCUMENTS

| | | | |
|---|---|---|---|
| 4,105,971 | A | 8/1978 | Nevalainen |
| 5,752,264 | A | 5/1998 | Blake et al. |
| 6,163,477 | A | 12/2000 | Tran |
| 6,204,679 | B1 | 3/2001 | Gray, III |
| 6,294,911 | B1 | 9/2001 | Shimazawa et al. |
| 6,406,545 | B2 | 6/2002 | Shoda et al. |

(Continued)

FOREIGN PATENT DOCUMENTS

| | | |
|---|---|---|
| JP | 2003069111 A | 3/2003 |
| JP | 2009115456 A | 5/2009 |

OTHER PUBLICATIONS

International Search Report and Written Opinion—PCT/US2013/037306—ISA/EPO—Jul. 5, 2013.

(Continued)

*Primary Examiner* — Min Huang
(74) *Attorney, Agent, or Firm* — Donald D. Min

(57) ABSTRACT

A hierarchical memory magnetoresistive random-access memory architecture is disclosed. In a particular embodiment, an apparatus includes a first magnetoresistive random-access memory (MRAM) device corresponding to a first level in a hierarchical memory system. The apparatus includes a second MRAM device corresponding to a second level in the hierarchical memory system. The first MRAM device has a first access latency and includes a first magnetic tunnel junction (MTJ) device having a first physical configuration. The second MRAM device has a second access latency and includes a second MTJ device having a second physical configuration. The first access latency is less than the second access latency.

37 Claims, 7 Drawing Sheets

(56) References Cited

U.S. PATENT DOCUMENTS

| | | | |
|---|---|---|---|
| 6,452,823 | B1 | 9/2002 | Naji |
| 6,621,731 | B2 | 9/2003 | Bessho et al. |
| 6,947,315 | B2 | 9/2005 | Iwata |
| 7,023,726 | B1 | 4/2006 | Chen et al. |
| 7,183,763 | B1 | 2/2007 | Murata |
| 7,230,420 | B2 | 6/2007 | Patland et al. |
| 7,538,546 | B2 | 5/2009 | Patland et al. |
| 7,741,860 | B2 | 6/2010 | Giessmann et al. |
| 7,872,471 | B2 | 1/2011 | Yamanaka et al. |
| 7,995,383 | B2 | 8/2011 | Li et al. |
| 8,040,131 | B2 | 10/2011 | Call et al. |
| 2008/0180109 | A1 | 7/2008 | Gregoritsch et al. |
| 2010/0153646 | A1* | 6/2010 | Chen et al. .................. 711/122 |
| 2011/0002163 | A1* | 1/2011 | Fukami et al. ............... 365/173 |
| 2011/0044096 | A1 | 2/2011 | Li |
| 2011/0154089 | A1* | 6/2011 | Wolfe et al. .................. 713/501 |
| 2011/0167222 | A1* | 7/2011 | Lee et al. ..................... 711/118 |
| 2012/0210188 | A1* | 8/2012 | Fee et al. ...................... 714/752 |
| 2014/0139209 | A1 | 5/2014 | Lee et al. |
| 2014/0254251 | A1 | 9/2014 | Lee et al. |

OTHER PUBLICATIONS

Smullen, C.W. et al., "Relaxing Non-volatility for Fast and Eenergy-efficient STT-RAM Caches", 2011 IEEE 17th International Symposium on High Performance Computer Architecture (HPCA), Feb. 12-16, 2011, IEEE Comput. Soc, IEEE, Piscataway, NJ, USA, pp. 50-61, ISSN: 978-1-4244-9432-3; DOI: 10.1 109/HPCA.2011. 5749716.

Zhenyu, S., et al., "Multi Retention Level STT-RAM Cache Designs with a Dynamic Refresh Scheme", Proceeding MICRO-44 '11 Proceedings of the 44th Annual IEEE/ACM International Symposium on Microarchitecture, Dec. 7, 2011, pp. 329-338, XP55068180, Porto Alegre, Brazil DOI: 10.1145/2155620.2155659 ISBN: 978-1-45-031053-6.

* cited by examiner

HIERARCHICAL MEMORY MAGNETORESISTIVE RANDOM-ACCESS MEMORY (MRAM) ARCHITECTURE

CLAIM OF PRIORITY UNDER 35 U.S.C. §119

The present application for patent claims priority to Provisional Application No. 61/635,346 entitled "MAGNETIC AUTOMATIC TEST EQUIPMENT (ATE) MEMORY TESTER DEVICE AND METHOD" filed Apr. 19, 2012, and assigned to the assignee hereof and hereby expressly incorporated by reference herein.

I. FIELD

The present disclosure is generally related to a hierarchical memory system.

II. DESCRIPTION OF RELATED ART

Advances in technology have resulted in smaller and more powerful computing devices. For example, there exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Data storage within portable computing devices may include many types of memory storage devices. As widespread adoption of portable computing devices and wireless computing devices increases, so has demand for high-density and low-power non-volatile memory. Many processing systems that implement hierarchical memory may use high-density, low-power non-volatile memory to satisfy constraints related to energy consumption and space limitations. High-speed static random-access memory (SRAM) has been implemented as cache memory in some computing devices because SRAM may provide relatively fast data access (e.g., read and write) and may be adapted for integration with complementary metal-oxide-semiconductor (CMOS) devices. However, SRAM is relatively large and susceptible to errors due to cosmic rays. Further, SRAM is volatile and retains data only while power is supplied to the SRAM. As a result, processing may be delayed after a power-off event while an SRAM cache is populated with data.

III. SUMMARY

A hierarchical memory system may include one or more magnetoresistive random-access memory (MRAM) devices that each includes one or more magnetic tunnel junction (MTJ) devices (e.g., an array of MTJ devices). The memory system may be implemented by memory associated with one or more levels of storage (e.g., L1 cache memory, L2 cache memory, and L3 cache memory). Based on a physical configuration of the MTJ device included in the MRAM device, the MTJ device may have one or more memory performance and storage characteristics (e.g., write program time, data retention, and memory size) consistent with a particular level of storage in the memory hierarchy that includes the MRAM device. Using an MRAM device in hierarchical memory storage instead of other types of memory devices (e.g., SRAM devices) may lead to a reduction in power consumed by the hierarchical memory storage. Use of the MRAM device may contribute to a reduction in a physical size of the hierarchical memory.

To use an MRAM device instead of an SRAM device in different levels of hierarchical memory storage (e.g., L1 cache, other closely coupled levels of hierarchical memory, or on-chip memory levels), the physical configuration of an MTJ device included in the MRAM device may be adjusted. The physical configuration of an MTJ device may be based on one or more dimensions (e.g., a width, a length, a diameter, or a thickness) of the MTJ device. In particular embodiments, the physical configuration may be based on one or more dimensions (e.g., width, a length, a diameter, or a thickness) of a free magnetic layer of a physical structure (e.g., MTJ stack) of the MTJ device. A change in one of the dimensions of the free magnetic layer may change one or more properties (e.g., a current density or a critical switching current density threshold) that affect performance characteristics, storage characteristics, or both, of the MTJ device. For example, a decrease in a width, a length, a thickness, a diameter, or a combination thereof, of a free magnetic layer of the MTJ device may lead to a decrease in write program time of the MTJ device and may cause the MTJ device to exhibit a decrease in data retention (e.g., a period of time data is retained). For example, a typical MTJ device may retain data for a long time (e.g., 10 years). However, an MTJ device that is configured to a particular size such that the write program time for the MTJ device is short enough for use in a particular level of hierarchical memory (e.g., L2 cache) may retain data for a shorter period of time (e.g., 10 seconds). Depending on particular characteristics of a level of hierarchical memory, a tradeoff may be made between the data retention and a size of the MTJ device. Thus, MTJ devices may be configured with different physical configurations and included within MRAM devices in different levels of storage in a hierarchical memory system.

In a particular embodiment, an apparatus includes a first MRAM device corresponding to a first level (e.g., a first cache memory level, such as L1 cache) in a hierarchical memory system. The apparatus includes a second MRAM device corresponding to a second level (e.g., a second cache memory level, such as L2 cache) in the hierarchical memory system. The first MRAM device has a first access latency (i.e., a first write program time) and may include an array of MTJ devices, such as a first representative MTJ device. The first MTJ device has a first physical configuration (e.g., a width of a free layer of the MTJ device, a length of the free layer, a thickness of the free layer, or a combination thereof). The second MRAM device has a second access latency (i.e., a second write program time) and includes an array of MTJ devices, such as a second representative MTJ device. The second MTJ device has a second physical configuration. The first access latency is less than the second access latency.

In another particular embodiment, a method of accessing hierarchical memory is disclosed. The method includes accessing a first memory location at a first MRAM device corresponding to a first level (e.g., a first cache memory level, such as L2 cache) in a hierarchical memory system. The first MRAM device has a first access latency and includes one or more MTJ devices, such as a representative first MTJ device having a first physical configuration. The method includes accessing a second memory location at a second MRAM device corresponding to a second level (e.g., a second cache memory level, such as L3 cache) in the hierarchical memory system. The second MRAM device has a second access latency and includes one or more MTJ devices, such as a representative second MTJ device having a second physical configuration. The first access latency is less than the second access latency.

In another particular embodiment, a method includes a first step for accessing a first memory location at a first MRAM device corresponding to a first level in a hierarchical memory system. The first MRAM device has a first access latency and includes a first MTJ device having a first physical configuration. The method includes a second step for accessing a second memory location at a second MRAM device corresponding to a second level in the hierarchical memory system. The second MRAM device has a second access latency and includes a second MTJ device having a second physical configuration. The first access latency is less than the second access latency.

In another particular embodiment, a computer-readable storage device is disclosed. The computer-readable storage device stores instructions executable by a processor to access a first memory location at a first MRAM device corresponding to a first level in a hierarchical memory system. The first MRAM device has a first access latency and includes a first MTJ device having a first physical configuration. The computer-readable storage device stores instructions that are executable by the processor to access a second memory location at a second MRAM device corresponding to a second level in the hierarchical memory system. The second MRAM device has a second access latency and includes a second MTJ device having a second physical configuration. The first access latency is less than the second access latency.

In another particular embodiment, a method includes receiving a data file comprising design information corresponding to a semiconductor device. The method includes fabricating the semiconductor device according to the design information. The semiconductor device comprises a first MRAM device corresponding to a first level in a hierarchical memory system. The semiconductor device comprises a second MRAM device corresponding to a second level in the hierarchical memory system. The first MRAM device has a first access latency and includes a first MTJ device having a first physical configuration. The second MRAM device has a second access latency and includes a second MTJ device having a second physical configuration. The first access latency is less than the second access latency.

One particular advantage provided by at least one of the disclosed embodiments is a reduction in cost associated with implementation of hierarchical memory. Because MRAM devices having MTJ devices may cost less than other types of memory devices, such as SRAM devices, costs may be reduced for implementation of hierarchical memory. Another particular advantage is a reduction in an overall area and distance between memory devices in a hierarchical memory storage system. Implementations of hierarchical memory storage with MTJ devices having particular physical configurations rather than other memory devices (e.g., SRAM devices) may reduce an area occupied by the hierarchical memory storage. A reduction in the area occupied may contribute to a reduction in distance between memory devices, which may decrease a delay (e.g., a wire delay) in memory access time. Yet another particular advantage is a reduction in power consumption based on reducing power leakage of memory storage devices. The amount of power leakage of memory devices may be reduced by implementing hierarchical memory storage with MRAM devices that include MTJ devices rather than other memory devices, such as SRAM devices.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
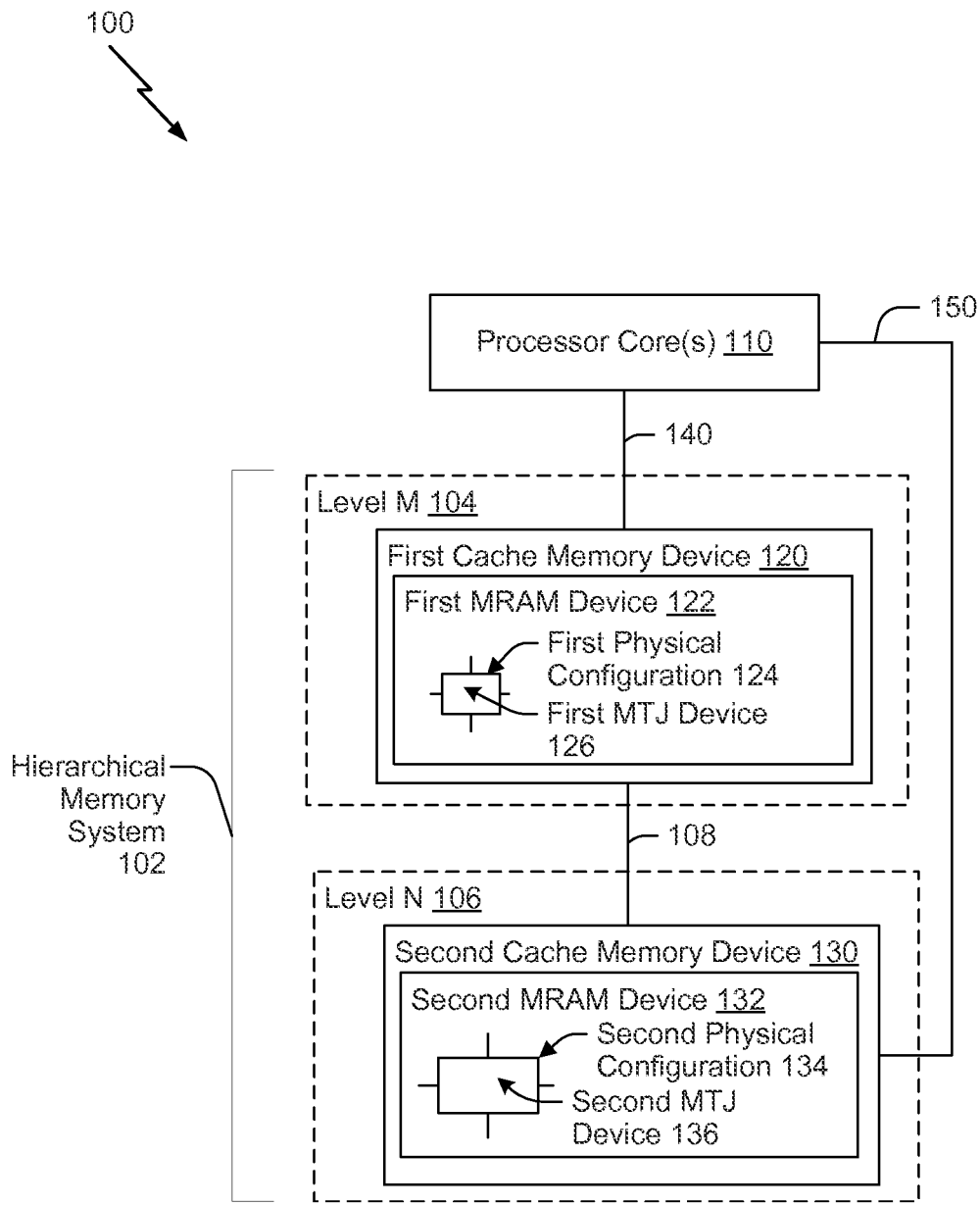
FIG. 1 is a block diagram of a particular illustrative embodiment of a system including hierarchical memory with magnetoresistive random-access memory (MRAM) devices.

Referring to FIG. 1, a particular illustrative embodiment of a system including hierarchical memory with magnetoresistive random-access memory (MRAM) devices is disclosed and generally designated 100. The system 100 may include one or more processor cores, such as a representative processor core 110. The system 100 may include a hierarchical memory system 102 that may manage data storage based on a memory hierarchy including a plurality of levels of storage, such as a level M 104 and a level N 106. The processor core 110 may include or may be coupled to one or more memory storage devices that may be included in the hierarchical memory system 102. For example, the processor core 110 may be coupled to a first cache memory device 120 of the level M 104 via a connection 140. The processor core 110 may be coupled to a second cache memory device 130 of the level N 106 via a connection 150. Alternatively, or in addition to the connection 150, the processor core 110 may access the one or more memory devices of the level N 106 via the first cache memory device 120. For example, the processor core 110 may access the second cache memory device 130 via a connection 108 between the first cache memory device 120 and the second cache memory device 130.

Each of the plurality of levels of the hierarchical memory system 102 may include one or more types of memory storage devices. In order of increasing distance from the processor core 110, the hierarchical memory system 102 may include one or more registers, cache memory, main memory (e.g., dynamic random access memory), and secondary storage (e.g., a hard disk drive device or a solid state drive). Each of the plurality of levels may have memory performance and storage characteristics including access latency, data retention (e.g., a time period that data is retained), one or more cache policies, a type of cache, a memory storage capacity, or a combination thereof. Each of the plurality of levels may have one or more memory performance or storage characteristics that are distinct from each other. As used herein, "access latency" refers to a program time ("write program time") to write data to a memory device, such as a magnetic tunnel junction device (MTJ). Thus, "access latency" may differ from a read time for the memory device. As used herein, "volatility" is a measure of data retention of a memory device (e.g., an MTJ device). A memory device that is non-volatile (i.e., has no volatility) retains data irrespective of time. Memory that is "pseudo-volatile" (i.e., exhibits "pseudo-volatility") retains data for a particular period of time (e.g., approximately 10 seconds). Memory that has some volatility retains data for a period of time greater than "pseudo-volatility."

In a particular embodiment, the level M 104 may correspond to a first level of the hierarchical memory system 102 and the level N 106 may correspond to a second level of the hierarchical memory system 102. The first level may be distinct from the second level. For example, the level M 104 may correspond to a first level of cache (e.g., L1 cache) and the level N 106 may correspond to a second level of cache (e.g., L2 cache). In another example, the level M 104 may correspond to a second level of cache (e.g., L2 cache) and the level N 106 may correspond to a third level of cache (e.g., L3 cache). The level M 104 may have one or more memory performance or storage characteristics that are distinct from corresponding memory performance or storage characteristics of the level N 106. The level M 104 may have an access latency (i.e. write program time) that is less than an access latency of the level N 106. The level M 104 may exhibit first data retention (e.g., volatility) that is distinct from second data retention of the level N 106. For example, the first data retention (e.g., first volatility) may be less than the second data retention (e.g., second volatility).

In a hierarchical memory system (e.g., the hierarchical memory system 102), a first level (e.g., the level M 104) of the hierarchical memory system that is closer to a processor core (e.g., the processor core 110) than a second level the level N 106) may exhibit a decrease in read time due to a shorter access distance between the first level and the processor core 110. Also, decreasing an area occupied by hierarchical memory storage may reduce a distance between memory devices in the hierarchical memory system. The reduction in distance may further contribute to a decrease in data read time, which may include delays (e.g., wire delays) attributed to distance separating the memory devices.

The level M 104 may include one or more memory devices including an MRAM device, a spin transfer torque MRAM (STT-MRAM) device, or both. In a particular embodiment, the level M 104 may include one or more first cache memory devices, including the first cache memory device 120. The first cache memory device 120 may include one or more MRAM devices, such as a first MRAM device 122. The first MRAM device 122 may include one or more memory cells (e.g., an array of memory cells). In a particular embodiment, the one or more memory cells in the first MRAM device 122 may include one or more magnetic tunnel junction (MTJ) devices, such as a representative first MTJ device 126. The first MRAM device 122 may include an array of MTJ devices. The first MTJ device 126 may have one or more physical configurations, such as a first physical configuration 124. To use an MRAM device in certain levels (e.g., the level M 104 or the level N 106) of the hierarchical memory system 102, the physical configuration of an MTJ device included in the MRAM device may be adjusted. The first physical configuration 124 may be based on one or more physical dimensions of the first MTJ device 126. For example, the first physical configuration 124 may be based on a physical size (e.g., a first physical size) of the first MTJ device 126. The first physical configuration may correspond to one or more dimensions (e.g., a width, a length, a diameter, and/or a thickness) of a structure (e.g., an MTJ stack) of the first MTJ device 126.

The first MRAM device 122 may have one or more memory performance characteristics (e.g., a first memory performance characteristic), such as a first access latency (L1) that corresponds to a write program time ($T_1$). The first MRAM device 122 may have a first data retention time (e.g., a first data retention time period), which corresponds to a time period in which data is retained by the first MRAM device 122. The one or more first memory performance characteristics may correspond to, or may result from, memory performance characteristics of the first MTJ device 126. The first MTJ device 126 may exhibit the first memory performance characteristics based having the first physical configuration 124. For example, the first MTJ device 126 may have the first access latency L1 based on the first MTJ device 126 having the first physical configuration 124.

In a particular embodiment, the write program time $T_1$ (i.e., the first access latency L1) corresponds to a time to write (i.e., "program") data to the first MTJ device 126. The write program time $T_1$ may be based on the first physical configuration 124 (e.g., a physical size of an MTJ stack of the first MTJ device 126). As shown in FIG. 1, a smaller size of the first MTJ device 126 may enable the first MTJ device 126 to have a shorter write program time $T_1$ to write data in comparison to a write program time of an MU device having a larger size. The program time for writing data to an MTJ device may change (e.g., decrease) in relation to a change in physical configuration (e.g., a decrease in size) of the MTJ device. The relationship between write program time and physical configurations of MTJ devices are further described with respect to FIGS. 2 and 3. Based on association with a higher level in the hierarchical memory system 102, the level M 104 may be configured to have particular performance characteristics (e.g., reduced read latency) to accommodate faster data writes to the level M 104.

The shorter write program time $T_1$ for writing data to the first MRAM device 122 may enable the data stored in the level M 104 to be written more frequently, thereby enabling the level M 104 to achieve particular performance characteristics consistent with the higher level of the hierarchical memory system 102. The first MTJ device 126 may be accessed frequently in the higher level (e.g., the level M 104) of the hierarchical memory system 102, such that the first MTJ device 126 may not have to retain data longer than a period of time data is retained. The first MTJ device 126 may be able to achieve the first access latency L1, although decreasing the size of the first MU device 126 affects the first data retention time period of the first MTJ device 126. The one or more first memory performance characteristics, such as the first access latency L1, the first data retention time period, or both, exhibited by the first MRAM device 122 may enable the level M 104 to maintain memory performance consistent with the hierarchical memory system 102.

The level N 106 may include one or more memory devices including a MRAM device, a STT-MRAM device, or both. In a particular embodiment, the level N 106 may include one or more second cache memory devices, such as the second cache memory device 130. The second cache memory device 130 may include one or more MRAM devices, such as a second MRAM device 132. The second MRAM device 132 may include one or more memory cells (e.g., an array of memory cells). In a particular embodiment, the one or more memory cells in the second MRAM device 132 may include one or more MTJ devices, such as a representative second MTJ device 136. The second MRAM device 132 may include an array of WMTJ devices. The second MTJ device 136 may have one or more physical configurations, such as a second physical configuration 134. The second physical configuration 134 may be based on one or more physical dimensions of the second MTJ device 136. For example, the second physical configuration 134 may be based on a physical size (e.g., a second physical size) of the second MTJ device 136. The second physical size may correspond to one or more dimensions (e.g., a width, a length, a diameter, and/or a thickness) of the second MTJ device 136.

The second MRAM device 132 may have one or more memory performance characteristics (e.g., a second memory performance characteristic), such as a second access latency (L2) that corresponds to a second write program time ($T_2$). The second MRAM device 132 may have a second data retention time (e.g., a first data retention time period), which corresponds to a time period during which data is retained by the second MRAM device 132. The one or more second memory performance characteristics may be consistent with memory performance characteristics associated with the level N 106. The one or more second memory performance characteristics may correspond to, or may result from, memory performance characteristics of the second MTJ device 136. The second MTJ device 136 may exhibit the second memory performance characteristics based on the second physical configuration 134. For example, the second MTJ device 136 may have the second access latency L2 based on the second MTJ device 136 having the second physical configuration 134. The one or more second memory performance characteristics, such as the second access latency L2, the second data retention time period, or both, exhibited by the second MRAM device 132 may enable the level N 106 to maintain memory performance consistent with the hierarchical memory system 104.

Figure 2:
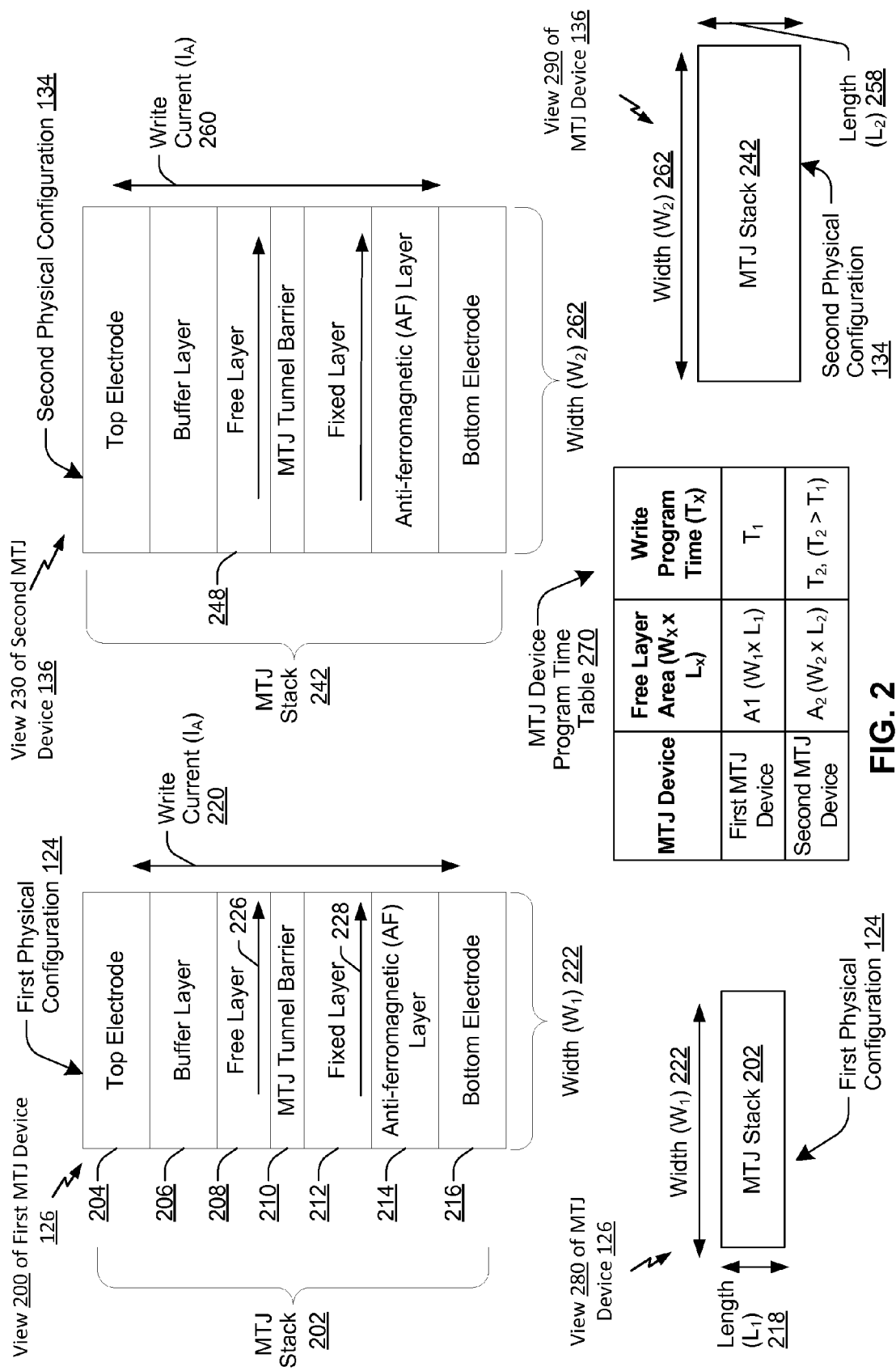
FIG. 2 is a top view and a cross-sectional view of a first particular embodiment of a magnetic tunnel junction (MTJ) devices of a hierarchical cache memory.

In a particular embodiment, the write program time $T_2$ (i.e., second access latency L2) may correspond to a time to write (i.e., "program") data to the second MTJ device 136. The write program time $T_2$ may be based on the second physical configuration 134 (e.g., a physical size of an MTJ stack of the second MTJ device 136). As shown in FIG. 2, the write program time $T_2$ may be longer in comparison to the write program time $T_1$ of the first MTJ device 126 because the second MTJ device 136 may have a larger physical size then the first MTJ device 126. At the expense of having a larger program time based on a larger physical size of an MTJ device, the MTJ device achieves better data retention (e.g., non-volatility). Thus, while the second MTJ device 136 has a greater write program time $T_2$, the second MTJ device 136 has better data retention. Thus, the second MTJ device 136 is more suitable as a memory storage device in a lower level (e.g., the level N 106) of the hierarchical memory system 102.

During operation, the processor core 110 may access data in one or more levels of storage (e.g., the level M 104 and the level N 106) of the hierarchical memory system 102. The processor core 110 may determine whether to access memory in the level M 104, the level N 106, or both, based on a determination of a type of the operation (e.g. an instruction fetch or a data store) being performed at the processor core 110, a type of storage (e.g., L1 cache, L2 cache, L3 cache, or secondary storage) to be accessed, or both.

In an illustrative example, the processor core 110 may access a plurality of levels of storage of the hierarchical memory system 102 to locate or store data (e.g., an instruction address or a data value). The processor core 110 may access a first memory location at the level M 104 (e.g., a first level) of the hierarchical memory system 102 to read or write the data. The level M 104 may correspond to a first level of cache memory, such as L1 cache memory. The processor core 110 may access the first memory location from the first cache memory device 120 via the connection 140. In accessing the first cache memory device 120, one or more first MRAM devices (e.g., the first MRAM device 122) may be accessed for the first memory location. A data value corresponding to the data may be written to the first MTJ device 126 of the first MRAM device 122 to store the data to the first memory location. Alternatively, a data value corresponding to the data may be read from the first memory location at the first MTJ device 126 of the first MRAM device. Other levels of storage of the hierarchical memory system 102 may be accessed to read or write the data. For example, the data may be located at or stored to a second memory location in a second level (e.g., the level N 106) of the hierarchical memory system 102 where the data may be replicated (e.g., copied). As a part of a memory access policy (e.g., data replication) to enable the data to remain retrievable, the data may be replicated to the second level based on data that is stored at the first memory location. As a result, although the data may no longer be accessible in the first level of cache memory, the data may be accessible from a second level of cache memory.

Thus, in response to determining that the data is not present in the first level of cache memory (e.g., incurring a cache miss) during an attempt to locate the data, the processor core 110 may attempt to access the data in a second memory location of another level, such as the level N 106 of the hierarchical memory system 102. To access the data in the level N 106, the processor core 110 may request the first cache memory device 120, coupled to the level M 104, to read the data at the second memory location from the second cache memory device 130 via the connection 108. Alternatively, the processor core 110 may access the data at the second memory location in the second cache memory device 130 directly via the connection 150.

One or more second MRAM devices (e.g., the second MRAM device 132) of the second cache memory device 130 may be accessed for the second location to read or write the data. A data value corresponding to the data may be written to the second MTJ device 136 of the second MRAM device 132 to store the data to the first memory location. Alternatively, a data value corresponding to the data may be accessed from the second MTJ device 136 of the second MRAM device 132 by reading the data from the second memory location. Other levels of storage, such as main memory and secondary storage of the hierarchical memory system 102, may be accessed to locate the data, in response to determining that the data is not present at the second memory location (e.g., incurring another cache miss).

Implementing hierarchical memory storage with MRAM devices that include MTJ devices may lower costs for implementing a hierarchical memory storage system. For example, MTJ devices may cost less than other types of memory devices, such as SRAM devices. MRAM devices that include MTJ devices may exhibit less volatility than SRAM devices, thereby improving data retention in hierarchical memory storage implemented with the MRAM devices. Implementing hierarchical memory storage with devices that use magnetic materials (e.g., MRAM devices) for storing data instead of other types of devices (e.g., SRAM devices) that use electrical mechanisms for storing data may reduce power consumed for storing data. As a result, when the MRAM device is powered off, the MRAM device may consume little or no power to maintain storage of data. Configuring an MTJ device with a particular configuration in an MRAM device of hierarchical memory storage may enable the MRAM device to exhibit improved data retention (e.g., pseudo-volatility or no volatility) and improved access latency (i.e., write program time) that enable a level of the memory hierarchy to maintain performance characteristics. Power consumption may also be reduced because the improved data retention (e.g., pseudo-volatility or no volatility) exhibited by a MRAM device in hierarchical memory storage may enable the MRAM device to retain data for a sufficient period of time without application of a current to refresh (e.g., by storing again) the data. As demand for greater storage capacity within processing systems increases, memory devices (e.g., MRAM devices) that consume less power, while maintaining high-density and non-volatile characteristics, are beneficial.

In FIG. 2, a top view and a cross-sectional view of a first particular embodiment of MTJ devices of a hierarchical cache memory are shown. A cross-sectional view of a particular embodiment of the first MTJ device 126 of FIG. 1 is shown and designated 200. A top view of a particular embodiment of the first MTJ device 126 is shown and designated 280. A cross-sectional view of a particular embodiment of the second MTJ device 136 is shown and designated 230. A top view of a particular embodiment of the second MTJ device 136 is shown and designated 290.

In the views 200 and 280, an MTJ stack 202 of the first MTJ device 126 is shown having the first physical configuration 124. The first physical configuration 124 may be based on a physical size of the first MTJ device 126, such as a width ($W_1$) 222 of the MTJ stack 202, a length ($L_1$) 218 of the MTJ stack 202, or both.

The MTJ stack 202 may include a top electrode 204, a buffer layer 206, a free layer (e.g., a first film layer) 208, an MTJ tunnel barrier 210, a fixed layer 212, an anti-ferromagnetic (AF) layer 214, and a bottom electrode 216. The bottom electrode 216 may be coupled to a source line. The top electrode 204 may be coupled to a bit line. The MTJ tunnel barrier 210 may be an oxide barrier layer (e.g., MgO, $Al_2O_3$, etc.), or other magnetic layer that is adapted to function as a tunnel junction or a barrier between the fixed layer 212 and the free layer 208. The width $W_1$ 222 of the MTJ stack 202 may be based on a width of the free layer 208, and the length $L_1$ 218 of the MTJ stack 202 may be based on a length of the free layer 208. An area $A_1$ of the free layer 208 may be based on the width $W_1$ 222 and the length $L_1$ 218.

The fixed layer 212 may include a magnetic domain 228 that has a fixed magnetic direction. The fixed layer 212 is coupled to the bottom electrode 216 via the AF layer 214, which pins the magnetic domain 228 to the fixed magnetic direction. The free layer 208 may be formed from a ferromagnetic material. The free layer 208 may include a magnetic domain 226 that has a programmable magnetic direction. The magnetic direction of the magnetic domain 226 may be programmed to a magnetic direction that causes the MTJ device to store a data value (e.g., a "1" or a "0" data value). A data value stored by an MTJ device 126 may be determined based on the magnetic direction of the magnetic domain 226 relative to the magnetic direction of the magnetic domain 228. When the magnetic direction of the magnetic domain 226 is oriented in the same direction as the fixed magnetic direction of the magnetic domain 228 (i.e., the first MTJ device 126 is in a "parallel" state), the MTJ device may store a logic "0" data value. When the magnetic direction of the magnetic domain 226 is oriented in a direction opposite to the fixed magnetic direction of the magnetic domain 228 (i.e., the first MTJ device 126 is in an "anti-parallel" state), the first MTJ device 126 may store a logic "1" data value.

The magnetic direction of the magnetic domain 226 may be programmed based on application of a write current ($I_A$) 220 to the MTJ stack 202. To write data, voltage may be applied to the first MTJ device 126 causing the write current 220 to flow between the source line and the bit line through the first MTJ device 126. The magnetic direction of the magnetic domain 226 may be adjusted when a current density of the MTJ stack 202 exceeds a threshold value, i.e., a critical switching current density threshold. When the write current 220 is flowing in a direction (e.g., down the MTJ stack 202) from the top electrode 204 to the bottom electrode 216 and the current density of the first MTJ device 126 exceeds a critical switching current density threshold, the magnetic direction of the magnetic domain 226 may change to the same direction as the fixed magnetic direction of the magnetic domain 228. As a result, a data value of a logic "0" may be stored in the first MTJ device 126. When the write current 220 is flowing in a direction (e.g., up the MTJ stack 202) from the bottom electrode 216 to the top electrode 204 and the current density of the first MTJ device 126 exceeds the critical switching current density threshold, the magnetic direction of the magnetic domain 226 may be adjusted in a direction that is opposite from the fixed magnetic direction of the magnetic domain 228. As a result, a data value of a logic "1" may be stored in the first MTJ device 126.

The write program time $T_1$ of the first MTJ device 126 may correspond to an amount of time the write current 220 is applied to the first MTJ device 126 until the critical switching current density threshold is reached, thereby effecting a change in the data value stored in the first MTJ device 126. The write program time $T_1$ may be based at least partially on the width $W_1$ 222, the length $L_1$ 218, or both. A current density of the MTJ stack 202 may decrease as the area of the MTJ stack 202 increases. Thus, a change in the physical size of the free layer 208 may affect the current density of the MTJ stack 202 and may affect the critical switching current density threshold of the MTJ stack 202. The critical switching current density threshold may decrease as a dimension (e.g., the width $W_1$ 222, the length $L_1$ 218, or both) of the free layer 208 decreases and may increase as a dimension of the free layer 208 increases. As the critical switching current density threshold increases due to an increase in a dimension of the free layer 208, the current 220 may be need to be applied for a longer period of time to reach the critical switching current density threshold, thereby increasing the write program time $T_1$.

One or more memory performance characteristics of the first MTJ device 126 may be based at least in part on the first physical configuration 124. An MTJ device may exhibit some volatility or pseudo-volatility (i.e., decreased data retention) as the critical switching current density threshold decreases. As the critical switching current density threshold decreases, less current may be needed to reach the critical switching current density threshold at which a change in a data value of the MTJ device (i.e., a write) may occur. Thus, volatility of the first MTJ device 126 may change as the critical switching current density threshold changes. The first MTJ device 126 may exhibit some volatility or pseudo-volatility based on the first physical configuration 124. The first MTJ device 126 may be suitable for use in the level M 104 because the first physical configuration 124 may enable the first MTJ device 126 to exhibit the first performance characteristics, such as relatively short data retention (e.g., pseudo-volatility) and the first access latency L1. The first performance characteristics may enable the level M 104 to maintain memory performance characteristics consistent with a first level of the hierarchical memory system 102.

In the views 230 and 290, an MTJ stack 242 of the second MTJ device 136 is shown having the second physical configuration 134. The second physical configuration 134 may be based on a physical size of the second MTJ device 136, such as a width ($W_2$) 262 of the MTJ stack 242, a length ($L_2$) 258 of the MTJ stack 242, or both. The MTJ stack 242 may include a plurality of elements, such as an MTJ tunnel barrier, one or more electrodes, a buffer layer, a fixed layer, a free layer, an AF layer, or a combination thereof. The plurality of elements may be in an arrangement similar to that of the MTJ stack 202. In a particular embodiment, the width $W_2$ 262 may be based on a width of a free layer 248 of the MTJ stack 242, and the length $L_2$ 258 may be based on a length of the free layer 248. An area $A_2$ of the free layer 248 may be based on the width $W_2$ 262 and the length $L_2$ 258. A data value may be stored in the second MTJ device 136 based on programming of magnetic direction of a magnetic domain in the free layer 248 by applying a write current ($I_A$) 260 to the MTJ stack 242.

The write program time $T_2$ of the second MTJ device 136 may correspond to an amount of time the write current 260 is applied to the second MTJ device 136 until a critical switching current density threshold is reached, thereby effecting a change in a data value stored in the second MTJ device 136. The write program time $T_2$ may be based at least partially on the width $W_2$ 262, the length $L_2$ 258, or both. A change in the physical size of the free layer 248 may affect the current density of the MTJ stack 242 and may affect the critical switching current density threshold of the MTJ stack 242. The critical switching current density threshold may decrease as a dimension (the width $W_2$ 262, the length $L_2$ 258, or both) of the free layer 248 decreases and may increase as a dimension of the free layer 248 increases. The write program time $T_2$ for applying the write current 260 to the second MTJ device 136 to reach the critical switching current density threshold may change corresponding to a change in dimension of the free layer 248.

One or more memory performance characteristics of the second MTJ device 136 device may be based at least in part on the second physical configuration 134. The second MTJ device 136 may exhibit little or no volatility as the critical switching current density threshold increases. For example, the second MTJ device 136 may exhibit little or no volatility based on the second physical configuration 134. The volatility of the second MTJ device 136 may be less than volatility of the first MTJ device 126 because dimensions of the free layer 248 of the second MTJ device 136 may be larger than the dimensions of the free layer 208 of the first MTJ device 126. Thus, the second MTJ device 136 may have a higher critical switching current density threshold than the first MTJ device 126. The second MTJ device 136 may be suitable for use in the level N 106 because the second physical configuration 134 may enable the second MTJ device 136 to exhibit the second performance characteristics, such as greater data retention (e.g., no volatility) and the second access latency L2. The second performance characteristics may enable the level N 106 to maintain memory performance characteristics consistent with a second level of the hierarchical memory system 102.

In FIG. 2, a MTJ Device Program Time Table 270 shows a relationship between an area ($A_x$) of a free layer of an MTJ device and a write program time ($T_x$) associated with the MTJ device. As shown in the MTJ Device Program Time Table 270, the first MTJ device 126 may have the write program time $T_1$ and may have the area $A_1$, and the second MTJ device 136 may have the write program time $T_1$ and may have the area $A_2$, where the write program time $T_2$ is greater than the write program time $T_1$. The write program time $T_2$ may be greater than the write program time $T_1$ because the area $A_2$ may be greater than the area $A_1$. In particular embodiments, the write program time $T_2$ may be different from the write program time $T_1$ when the area $A_2$ is different from the area $A_1$.

In particular embodiments, the first physical configuration 124, the second physical configuration 134, or both, may be based on a particular type of MRAM technology. For example, the first physical configuration 124 may be based on an STT-MRAM technology implemented in the first MRAM device 122 and the second physical configuration 134 may be based on an STT-MRAM technology implemented in the second MRAM device 132. In the particular embodiments shown in FIG. 2, the first physical configuration 124 and the second physical configuration 134 may be based on in-plane STT-MRAM technology implemented in the first MRAM device 122 and the second MRAM device 132, respectively.

Although not shown in FIG. 2, in particular embodiments, the first physical configuration 124 and the second physical configuration 134 may be based on perpendicular STT-MRAM technology included in the first MRAM device 122 and the second MRAM device 132, respectively. In these embodiments in which the first MRAM device 122 and the second MRAM device 132 are implemented by perpendicular STT-MRAM technology, the first physical configuration 124 and the second physical configuration 134 may be based on a circular configuration of the MTJ stack 202 and the MTJ stack 242, respectively. In such a circular configuration, the first physical configuration 124 may be based on a diameter of the MTJ stack 202 and the second physical configuration 134 may be based on a diameter of the MTJ stack 242, where the diameter may correspond to a diameter of a free layer. An area of the MTJ stack 202 or the MTJ stack 242 may change based on a change in the diameter of the free layer. A change in a diameter of a free layer may affect a critical switching current density threshold of an MTJ stack (e.g., the MTJ stack 202 and the MTJ stack 242). The effect due to a change in diameter of the free layer is similar to the effect caused by a change in a width or a height of the free layer on the critical switching current density threshold. Thus, the critical switching current density threshold may decrease as a diameter of a free layer decreases, and the critical switching current density threshold may increase as the diameter increases. Accordingly, one or more memory performance characteristics (e.g., data retention and write program time) of an MTJ device (e.g., the first MTJ device 126 or the second MTJ device 136) may be affected by a change in a physical configuration (e.g., the first physical configuration 124 or the second physical configuration 134) that is based on perpendicular STT-MRAM technology.

An MTJ device of an MRAM device may be configured to exhibit particular memory performance characteristics that are consistent with a particular level of hierarchical memory storage including the MRAM device. Implementing an MRAM device within hierarchical memory storage may reduce volatility of a particular level of hierarchical memory storage while maintaining storage density and write latency associated with the particular level of memory hierarchy.

Figure 3:
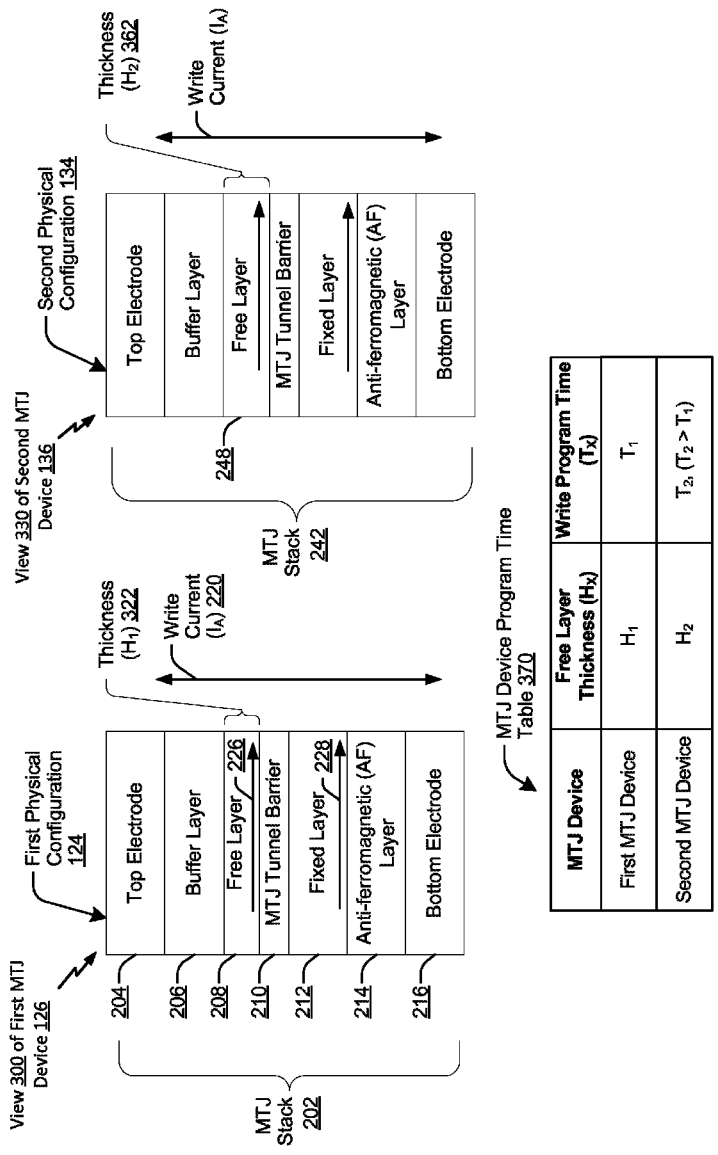
FIG. 3 is a cross-sectional view of a second particular embodiment of MTJ devices of a hierarchical cache memory.

In FIG. 3, a cross-sectional view of a particular embodiment of the first MTJ device 126 of FIG. 1 is shown and designated 300. A cross-sectional view of a particular embodiment of the second MTJ device 136 is shown and designated 330.

In the view 300, the MTJ stack 202 of FIG. 2 is shown having the first physical configuration 124. The first physical configuration 124 may be based on a physical size of the first MTJ device 126, such as a thickness ($H_1$) 322 of the MTJ stack 202. The thickness $H_1$ 322 of the MTJ stack 202 may be based on a thickness of the free layer 208. In the view 330, the MTJ stack 242 is shown having the second physical configuration 134. The second physical configuration 134 may be based on a physical size of the second MTJ device 136, such as a thickness ($H_2$) 362 of the MTJ stack 242. The thickness $H_2$ 362 of the MTJ stack 242 may be based on a thickness of the free layer 248.

The write program time $T_1$ and the write program time $T_2$ may be based at least partially on the thickness $H_1$ 322 and the thickness $H_2$ 362, respectively. Similar to the effect that a change in an area of a free layer may have on critical switching current density threshold, a change in a thickness of a free layer (e.g., the free layer 208 and the free layer 248) may effect the critical switching current density threshold of an MTJ stack (e.g., the MTJ stack 202 and the MTJ stack 242). The critical switching current density threshold may decrease as a thickness (e.g., the thickness $H_1$ 322 or the thickness $H_2$ 362) of a free layer decreases and the critical switching current density threshold may increase as the thickness increases. Thus, the write program time $T_1$ and the write program time $T_2$ may increase as the thickness $H_1$ 322 and the thickness $H_2$ 362, respectively, increase.

A MTJ Device Program Time Table 370 shows a relationship between a thickness ($H_x$) of a free layer of an MTJ device and a write program time ($T_x$) associated with the MTJ device. As shown in the MTJ Device Program Time Table 370, the write program time may be greater than the write program time $T_1$ because the thickness $H_2$ 362 may be greater than the thickness 322. In particular embodiments, the write program time $T_2$ may be different from the write program time $T_1$ because the thickness $H_2$ 362 is different from the thickness $H_1$ 322.

Figure 4:
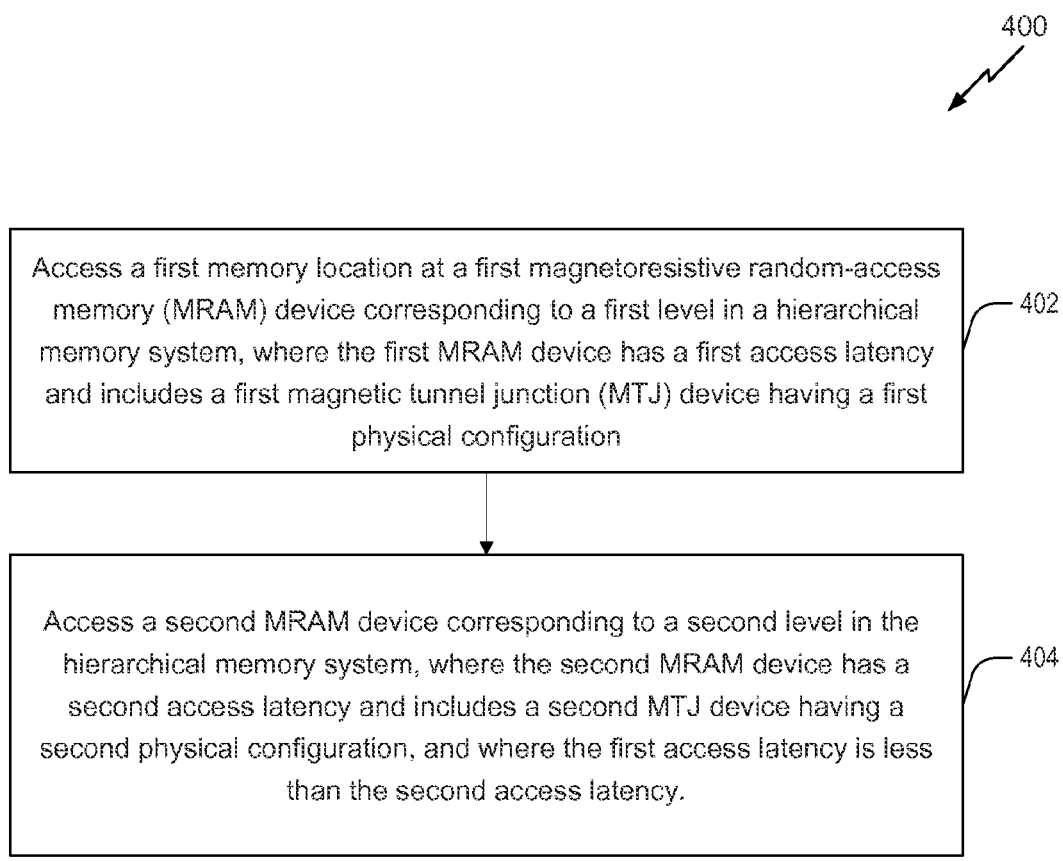
FIG. 4 is a flow chart of a particular illustrative embodiment of a method of accessing hierarchical memory including MTJ devices.

In FIG. 4, a flow diagram of a particular illustrative embodiment of a method 400 of accessing hierarchical memory including MTJ devices is shown. The method 400 may be performed by the processor core 110 of FIG. 1.

At 402, the method 400 includes accessing a first memory location at a first MRAM device corresponding to a first level in a hierarchical memory system. The first MRAM device has a first access latency and includes first MTJ device having a first physical configuration. For example, the processor core 110 of FIG. 1 may access a first memory location at the first MRAM device 122 corresponding to the level M 104 of the hierarchical memory system 102. The first MRAM device 122 may have the first access latency L1 and may have the first physical configuration 124.

At 404, the method 400 includes accessing a second memory location at a second MRAM device corresponding to a second level in the hierarchical memory system. For example, the second memory location may indicate a location of data stored in the second level of the hierarchical memory system and may be accessed in response to a cache miss at the first memory level. The second MRAM device has a second access latency and includes a second MTJ device having a second physical configuration. The first access latency is less than the second access latency. For example, the processor core 110 of FIG. 1 may access a second memory location at the second MRAM device 132 corresponding to the level N 106 of the hierarchical memory system 102. The second MRAM device 132 may have a second access latency L2 and may have the second physical configuration 134. The first access latency L1 is less than the second access latency L2.

Figure 5:
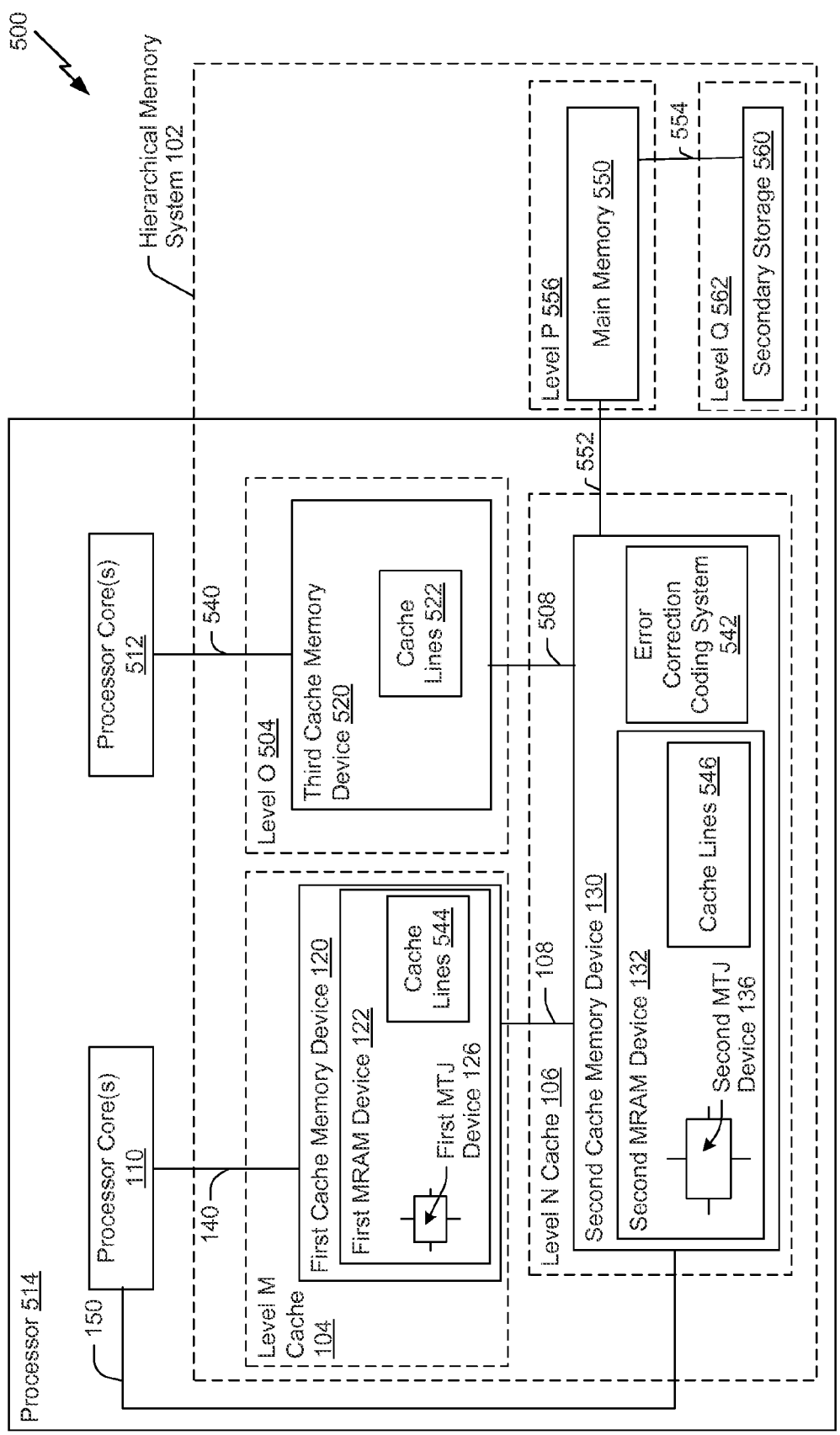
FIG. 5 is a block diagram of a particular illustrative embodiment of a system including a processor having hierarchical memory devices including a MTJ device.

In FIG. 5, a block diagram of a particular illustrative embodiment of a system including a processor having hierarchical memory devices including a MTJ device is shown and designated 500.

The system 500 may include a processor 514 that includes a plurality of processor cores, such as the processor core 110 and a processor core 512. The processor 514 may include or may be implemented on a processor chip, such as a multi-core processor chip. The processor 514 may include one or more types of memory storage devices, such as on-chip memory storage devices. The memory storage devices may include one or more cache memory devices, such as the first cache memory device 120, the second cache memory device 130, and a third cache memory device 520.

The processor cores 110, 512 may be coupled to one or more of the memory storage devices located on board the processor 514 (i.e., on-chip memory) or may be external to the processor. In FIG. 5, the processor core 110 is coupled to the first cache memory device 120 and to the second cache memory device 130. The processor core 512 may be coupled to the third cache memory device 520 via a connection 540. The processor 514 may be coupled to one or more external storage devices via one or more memory storage devices of the processor 514. For example, the second cache memory device 130 of the processor 514 may be coupled to a main memory 550 via a connection 552. The system may also include a secondary storage 560, which may be accessible through the main memory 550 via a connection 554.

The memory storage devices of the system 500 may be organized in one or more levels of the hierarchical memory system 102. The levels of storage may include the level M 104, the level N 106, a level O 504 (including the third cache memory device 520), a level P 556 (including the main memory 550), and a level Q 562 (including the secondary storage 560). In a particular embodiment of the system 500, the level M 104 and the level O 504 may correspond to a first level of the hierarchical memory system 102, the level N 106 may correspond to a second level of the hierarchical memory system 102, the level P 556 may correspond to a third level of the hierarchical memory system 102, and the level Q 562 may correspond to a fourth level of the hierarchical memory system 102. In the embodiment shown in the system 100, the first level may be higher than the second level, the second level may be higher than the third level, and the third level may be higher than the fourth level. In one example, the level M 104 and the level O 504 may correspond to a second level of cache (e.g., L2 cache) and the level N 106 may correspond to a third level of cache (e.g., L3 cache). In another example, the level M 104 and the level O 504 may correspond to a first level of cache (e.g., L1 cache) and the level N 106 may correspond to a second level of cache (e.g., L2 cache).

Read access time in the processor 514 may be improved due to a shorter distance between processor core and memory, and to an overall area consumed on the processor 514 may be reduced by including MRAM devices, such as the first MRAM device 122 and the second MRAM device 132, instead of SRAM devices. Choosing an MRAM device instead of an SRAM device may save area on the processor 514 because an MRAM device (e.g., an STT-MRAM device) may occupy a smaller area on the processor in comparison to an SRAM device. A savings in area on the processor 514 by inclusion of the MRAM devices 122, 132 may enable the first cache memory 120 to function as private memory storage, accessible to the processor core 110 and not accessible to processor core 512. Thus, MRAM devices in the first cache memory device 120, such as the first MRAM device 122, may be accessible to the processor core 110 and may not be accessible to the processor core 512. As a result, read latency of the first cache memory device 120 may improve because the first cache memory device 120 manages data for one processor core rather being shared between processor cores. Other MRAM devices that are not included in private memory storage (e.g., the second MRAM device 132) may be shared between processor cores, one or more memory storage devices, or both. In other embodiments, memory devices in a plurality of levels of the hierarchical memory system 102 may operate as private memory storage, accessible to a particular processor core.

In a particular embodiment, an access policy to maintain accessibility to data may be implemented in one or more levels of the hierarchical memory system 102 that exhibit volatility. For example, an access policy may be implemented in the level M 104 (e.g., a first level) of the hierarchical memory system 102, such as for the first cache memory device 120 because the volatility (e.g., psuedo-volatility) of the first MRAM device 122 may be greater than the volatility (e.g., no volatility) of the second MRAM device 132. The access policy may enable data to be replicated (i.e., copied) from the first MRAM device 122 to another storage device, such as the second MRAM device 132, which exhibits better data retention due to little or no volatility. Thus, the access policy may ensure that data that may otherwise be inaccessible to the processor core 110 from the first MRAM device 122 is retrievable from another less volatile storage device, such as the second MRAM device 132.

In a particular embodiment, the second MRAM device 132 may be implemented as a shared memory device that stores data copied (e.g., replicated according to an access policy) from one or more other levels in the hierarchical memory system 102. For example, the second MRAM device 132 may be a shared memory device that stores replicated (e.g., copied) data from both the third cache memory device 520 of the level O 504 and the first cache memory device 120 of the level M 104. The second MRAM device 132 may store the replicated data in cache lines 546. The replicated data may include data from cache lines 522 of the third cache memory device 520, data from cache lines 544 of the first cache memory device 120, or both. It may be appreciated that the first cache memory device 120, the third cache memory device 520, or both, may retrieve and store a portion of replicated data from the cache lines 546 that may correspond to data that was not retained due to volatility.

When an MRAM device exhibits some volatility, the MRAM device may still be radiation-hardened, such that the MRAM device may not include an error code correction (ECC) mechanism to safeguard against data loss due to radiation. For example, the first MRAM device 122 may not include an ECC mechanism. The second cache memory device 130 may include an ECC system 542 that performs one or more ECC mechanisms to ensure that data (e.g., the cache lines 546 and the cache lines 522) stored based on an access policy are maintained without errors.

In a processor (e.g., the processor 514) having hierarchical memory storage, an overall area and distance between memory devices in the processor (e.g., on-board a processor chip) may be reduced by including an MRAM device having at least one MTJ device. Instead of other memory devices, such as SRAM devices, a processor that includes MRAM devices having at least one MTJ device may decrease area occupied on the processor, thereby reducing distance between memory devices of the processor. The reduction in distance may contribute to a decrease in memory access time that includes delays (e.g., wire delays) attributed to distance separating memory storage devices. Including the MRAM device in hierarchical memory storage may improve data retention because the MRAM device may exhibit improved volatility (e.g., pseudo-volatility or no volatility) when included in particular levels of hierarchical memory storage.

Further, because MRAM devices may exhibit improved data retention in particular levels of hierarchical memory storage and may be radiation-hardened, an ECC mechanism may not be needed for data retention. MRAM devices implemented in different levels of hierarchical memory may share memory cell footprints while having different configurations based on MTJ devices within MRAM devices. MRAM devices, unlike hybrid memories, may be manufactured through a common process integration flow despite having different configurations to be used in multiple levels of hierarchical memory. Thus, complexity and power consumption may be reduced for hierarchical memory including MRAM devices that have MTJ devices.

Figure 6:
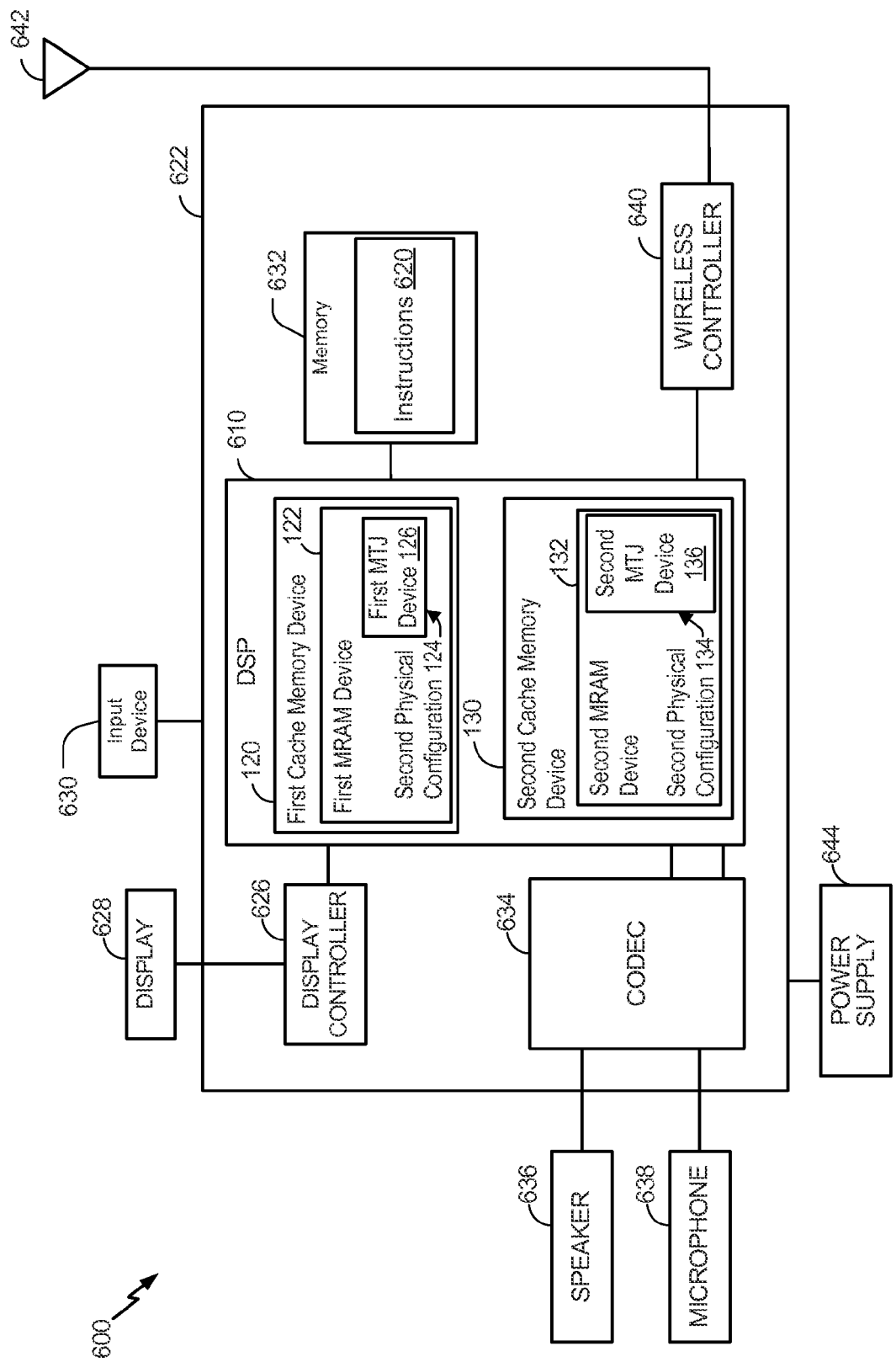
FIG. 6 is a block diagram of a communication device including hierarchical memory with MRAM devices.

Referring to FIG. 6, a block diagram of a particular illustrative embodiment of a communication device including hierarchical memory with MRAM devices is depicted and generally designated 600. The device 600 includes a processor, such as a digital signal processor (DSP) 610, coupled to a memory 632.

In an illustrative embodiment, the wireless electronic device 600 may include the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the processor core 110 of FIG. 1, the processor 514 of FIG. 5, the hierarchical memory system 102 of FIG. 1 or any components thereof, the hierarchical memory system 502 of FIG. 5 or any components thereof, the processor core 512 of FIG. 5, or any combination thereof. The wireless electronic device 600 may operate according to the methods or functions described with reference to FIGS. 1-5. For example, modules may be integrated into the DSP 610 and may include dedicated circuitry or other logic to perform at least a portion of the functionality described with reference to FIGS. 1-5.

The memory 632 may be a non-transitory, tangible computer-readable and/or processor-readable storage device that stores instructions 620. The instructions 620 may be executable by the DSP 610 to implement or operate the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the processor core 110 of FIG. 1, the processor 514 of FIG. 5, the hierarchical memory system 102 of FIG. 1 or any components thereof, the hierarchical memory system 502 of FIG. 5 or any components thereof, the processor core 512 of FIG. 5, or a combination thereof. For example, the instructions 620 may include instructions that may be executable by the DSP 610 to perform one or more functions or methods described with respect to the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the processor core 110 of FIG. 1, the processor 514 of FIG. 5, the hierarchical memory system 102 of FIG. 1 or any components thereof, the hierarchical memory system 502 of FIG. 5 or any components thereof, the processor core 512 of FIG. 5, or a combination thereof. The instructions 620 may include instructions that are executable by the DSP 610 to cause the DSP 610 to perform one or more functions or methods described with reference to FIGS. 1-5. In other embodiments, one or more functions described herein as being performed by the processor (e.g., the DSP 610) executing instructions from the memory 632 may instead be performed by dedicated hardware (e.g., a programmable logic arrays, a FPGA device, an ASIC, or a processing unit programmed to perform identified functions, such as a CPU, a microprocessor, an ARM processor, a controller, another hardware device, or a firmware device, or any combination thereof).

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless controller 640 can be coupled to the digital signal processor 610 and to a wireless antenna 642. In a particular embodiment, the DSP 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

In conjunction with the described embodiments, an apparatus is disclosed that may include means for storing a first value. For example, the means for storing the first value may include the first cache memory device 120 of FIG. 1, the first MRAM device 122 of FIG. 1, the first MTJ device 126 of FIG. 1, the MTJ stack 202 of FIGS. 2 and 3, one or more other devices or circuits configured to store the first value, or any combination thereof. The means for storing the first value may be a first cache memory device. The means for storing the first value may include a first MRAM device that corresponds to a first level in a hierarchical memory system, has a first access latency, and includes a first MTJ device. The first MTJ device may have a first physical configuration. The apparatus includes means for storing a second value. For example, the means for storing the second value may include the second cache memory device 130 of FIG. 1, the second MRAM device 132 of FIG. 1, the second MTJ device 136 of FIG. 1, the MTJ stack 242 of FIGS. 2 and 3, one or more other devices or circuits configured to store the second value, or any combination thereof. The means for storing the second value may be a second cache memory device. The means for storing the second value may include a second MRAM device that corresponds to a second level in a hierarchical memory system, has a second access latency, and includes a second MTJ device. The second MTJ device may have a second physical configuration. A first access latency of first MRAM device may be less than the second access latency.

Figure 7:
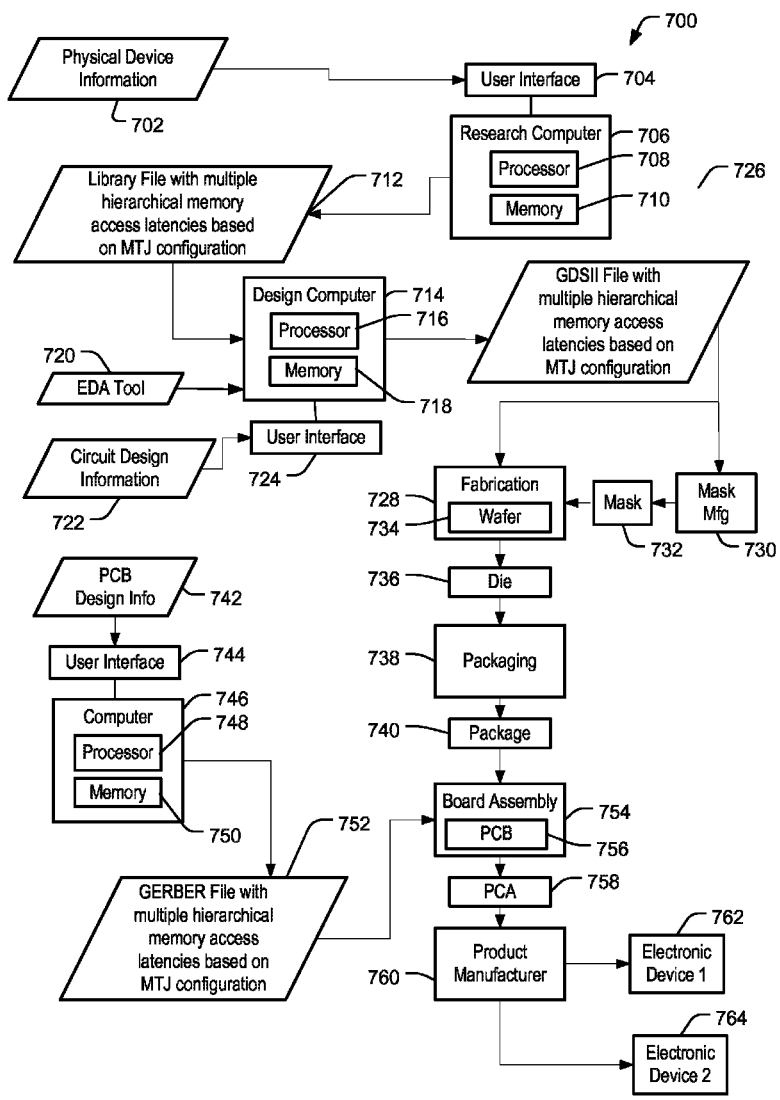
FIG. 7 is a data flow diagram of a particular illustrative embodiment of a manufacturing process to manufacture electronic devices having hierarchical memory including MTJ devices.

The foregoing disclosed devices and functionalities (such as devices of FIGS. 1-3 and 5-7, the method 400 of FIG. 4, or both) may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in devices described above. FIG. 7 depicts a particular illustrative embodiment of a manufacturing process to manufacture electronic devices having hierarchical memory including MTJ devices.

Physical device information 702 is received at the manufacturing process 700, such as at a research computer 706. The physical device information 702 may include design information representing at least one physical property of a semiconductor device, such as the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof, in addition to other circuits or information. To illustrate, the data file may include information corresponding to a system-on-chip (SOC) that includes the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or a combination thereof, and that also includes additional electronic circuits and components within the SOC.

The GDSII file 726 may be received at a fabrication process 728 to manufacture the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a circuit including a device that includes the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof.

The die 736 may be provided to a packaging process 738 where the die 736 is incorporated into a representative package 740. For example, the package 740 may include the single die 736 or multiple dies, such as a system-in-package (SiP) arrangement, The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA) a fixed location data unit, and a computer, into which the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5 is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes the first cache memory device 120 of FIG. 1, the second cache memory device 130 of FIG. 1, the first MRAM device 122 of FIG. 1, the second MRAM device 132 of FIG. 1, a first MTJ device 126 of FIG. 1, the second MTJ device 136 of FIG. 1, the MTJ stack 202 of FIGS. 2 and 3, the MTJ stack 242 of FIGS. 2 and 3, the processor 514 of FIG. 5, or any combination thereof, may be fabricated, processed, and incorporated into an electronic device, as described in the illustrative process 700. One or more aspects of the embodiments disclosed with respect to FIGS. 1-6 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a first magnetoresistive random-access memory (MRAM) device corresponding to a first level in a hierarchical memory system; and
a second MRAM device corresponding to a second level in the hierarchical memory system,
wherein the first MRAM device has a first access latency, has a first data retention time period, and includes a first magnetic tunnel junction (MTJ) device having a first physical configuration, wherein the second MRAM device has a second access latency, has a second data retention time period, and includes a second MTJ device having a second physical configuration, wherein the first access latency is less than the second access latency, and wherein the first data retention time period is shorter than the second data retention time period.

2. The apparatus of claim 1, wherein the first physical configuration corresponds to a first physical size of the first MTJ device, wherein the second physical configuration corresponds to a second physical size of the second MTJ device.

3. The apparatus of claim 1, wherein the first physical configuration corresponds to a first dimension of a first film layer in the first MTJ device, wherein the second physical configuration corresponds to a second dimension of a second film layer in the second MTJ device, and wherein the first film layer is thinner than the second film layer.

4. The apparatus of claim 1, wherein the first MRAM device is included in a first cache memory device of a processor, the first cache memory device corresponding to the first level, and wherein the second MRAM device is included in a second cache memory device of the processor, the second cache memory device corresponding to the second level.

5. The apparatus of claim 4, wherein the second cache memory device stores data that is also stored within the first cache memory device.

6. The apparatus of claim 4, wherein the first cache memory device does not include an error correction coding (ECC) mechanism, and wherein the second cache memory device includes the ECC mechanism.

7. The apparatus of claim 1, wherein the first MRAM device and the second MRAM device are included in a processor having multiple processor cores, and wherein the first MRAM device is accessible to a first processor core and is not accessible to a second processor core that is distinct from the first processor core.

8. The apparatus of claim 1, wherein the first MRAM device, the second MRAM device, or both, are a spin transfer torque magnetoresistive random-access memory (STT-MRAM) device.

9. The apparatus of claim 1, wherein the first MRAM device and the second MRAM device are integrated in at least one semiconductor die.

10. The apparatus of claim 1, wherein the first MRAM device and the second MRAM device are integrated in a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof, into which the first MRAM device and the second MRAM device are integrated.

11. A method comprising:
accessing a first memory location at a first magnetoresistive random-access memory (MRAM) device corresponding to a first level in a hierarchical memory system, wherein the first MRAM device has a first access latency, has a first data retention time period, and includes a first magnetic tunnel junction (MTJ) device having a first physical configuration; and accessing a second memory location at a second MRAM device corresponding to a second level in the hierarchical memory system, wherein the second MRAM device has a second access latency, has a second data retention time period, includes a second MTJ device having a second physical configuration, and wherein the first access latency is less than the second access latency, and wherein the first data retention time period is shorter than the second data retention time period.

12. The method of claim 11, wherein the first physical configuration corresponds to a first physical size of the first MTJ device, wherein the second physical configuration corresponds to a second physical size of the second MTJ device, and wherein the first physical size is smaller than the second physical size.

13. The method of claim 11, wherein the first physical configuration corresponds to a first dimension of a first film layer in the first MTJ device, wherein the second physical configuration corresponds to a second dimension of a second film layer in the second MTJ device, and wherein the first film layer is thinner than the second film layer.

14. The method of claim 11, wherein the first MRAM device is included in a first cache memory device of a processor, the first cache memory device corresponding to the first level, and wherein the second MRAM device is included in a second cache memory device of the processor, the second cache memory device corresponding to the second level.

15. The method of claim 14, wherein the second cache memory device stores data that is also stored within the first cache memory device.

16. The method of claim 14, wherein the first cache memory device does not include an error correction coding (ECC) mechanism, and wherein the second cache memory device includes the ECC mechanism.

17. The method of claim 11, wherein the first MRAM device and the second MRAM device are included in a processor having multiple processor cores, and wherein the first MRAM device is accessible to a first processor core and is not accessible to a second processor core that is distinct from the first processor core.

18. The method of claim 11, wherein the first MRAM device, the second MRAM device, or both are a spin transfer torque magnetoresistive random-access memory (STT-MRAM) device.

19. The method of claim 11, wherein accessing the first memory location and accessing the second memory location are performed at a processor integrated into an electronic device.

20. A method comprising:
a first step for accessing a first memory location at a first magnetoresistive random-access memory (MRAM) device corresponding to a first level in a hierarchical memory system, wherein the first MRAM device has a first access latency, has a first data retention time period, and includes a first magnetic tunnel junction (MTJ) device having a first physical configuration; and
a second step for accessing a second memory location at a second MRAM device corresponding to a second level in the hierarchical memory system, wherein the second MRAM device has a second access latency, has a second data retention time period, and includes a second MTJ device having a second physical configuration, wherein the first access latency is less than the second access latency, and wherein the first data retention time period is shorter than the second data retention time period.

21. The method of claim 20, wherein the first step and the second step are initiated by a processor integrated into an electronic device.

22. An apparatus comprising:
means for storing a first value, wherein the means for storing the first value includes a first magnetoresistive random-access memory (MRAM) device that corresponds to a first level in a hierarchical memory system, has a first access latency, has a first data retention time period, and includes a first magnetic tunnel junction (MTJ) device, the first MTJ device having a first physical configuration; and
means for storing a second value, wherein the means for storing the second value includes a second MRAM device that corresponds to a second level in the hierarchical memory system, has a second access latency, has a second data retention time period, and includes a second MTJ device, the second MTJ device having a second physical configuration, wherein the first access latency is less than the second access latency, and wherein the first data retention time period is shorter than the second data retention time period.

23. The apparatus of claim 22, wherein the first physical configuration corresponds to a first physical size of the first MTJ device, wherein the second physical configuration corresponds to a second physical size of the second MTJ device, and wherein the first physical size is smaller than the second physical size.

24. The apparatus of claim 22, wherein the first physical configuration corresponds to a first dimension of a first film layer in the first MTJ device, wherein the second physical configuration corresponds to a second dimension of a second film layer in the second MTJ device, and wherein the first film layer is thinner than the second film layer.

25. The apparatus of claim 22, wherein the means for storing the first value is a first cache memory device of a processor, the first cache memory device corresponding to the first level, and wherein means for storing the second value is a second cache memory device of the processor, the second cache memory device corresponding to the second level.

26. The apparatus of claim 22, wherein the apparatus is a processor having multiple processor cores, and wherein the first MRAM device is accessible to a first processor core and is not accessible to a second processor core that is distinct from the first processor core.

27. The apparatus of claim 22, wherein the means for storing the first value, the means for storing the second value, or both, are integrated in at least one semiconductor die.

28. The apparatus of claim 22, wherein the means for storing the first value and the means for storing the second value are integrated in a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof, into which the means for storing the first value and the means for storing the second value are integrated.

29. A computer-readable storage device storing instructions executable by a processor to:
access a first memory location at a first magnetoresistive random-access memory (MRAM) device corresponding to a first level in a hierarchical memory system, wherein the first MRAM device has a first access latency, has a first data retention time period, and includes a first magnetic tunnel junction (MTJ) device having a first physical configuration; and access a second memory location at a second MRAM device corresponding to a second level in the hierarchical memory system, wherein the second MRAM device has a second access latency, has a second data retention time period, and includes a second MTJ device having a second physical configuration, wherein the first access latency is less than the second access latency, and wherein the first data retention time period is shorter than the second data retention time period.

30. The computer-readable storage device of claim 29, wherein the first physical configuration corresponds to a first physical size of the first MTJ device, wherein the second physical configuration corresponds to a second physical size of the second MTJ device, and wherein the first physical size is smaller than the second physical size.

31. The computer-readable storage device of claim 29, wherein the first physical configuration corresponds to a first dimension of a first film layer in the first MTJ device, wherein the second physical configuration corresponds to a first dimension of a second film layer in the second MTJ device, and wherein the first film layer is thinner than the second film layer.

32. The computer-readable storage device of claim 29, wherein the first MRAM device is included in a first cache memory device of a processor, the first cache memory device corresponding to the first level, and wherein the second MRAM device is included in a second cache memory device of the processor, the second cache memory device corresponding to the second level.

33. The computer-readable storage device of claim 29, wherein the first MRAM device and the second MRAM device are included in a processor having multiple processor cores, and wherein the first MRAM device is accessible to a first processor core and is not accessible to a second processor core that is distinct from the first processor core.

34. The computer-readable storage device of claim 29, wherein the instructions are executable by a processor integrated into a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof.

35. The apparatus of claim 1, wherein the first MRAM device and the second MRAM device are spin transfer torque magnetoresistive random-access memory (STT-MRAM) devices.

36. The apparatus of claim 35, wherein the first MRAM device and the second MRAM device are in-plane STT-MRAM devices.

37. The apparatus of claim 35, wherein the first MRAM device and the second MRAM device are perpendicular STT-MRAM devices.

\* \* \* \* \*